(12) United States Patent
Harney et al.

(10) Patent No.: US 7,040,922 B2
(45) Date of Patent: May 9, 2006

(54) MULTI-SURFACE MOUNTING MEMBER AND ELECTRONIC DEVICE

(75) Inventors: Kieran P. Harney, Andover, MA (US); Lawrence E. Felton, Hopkinton, MA (US); Lewis Long, Woburn, MA (US)

(73) Assignee: Analog Devices, Inc., Norwood, MA (US)

( * ) Notice: Subject to any disclaimer, the term of this patent is extended or adjusted under 35 U.S.C. 154(b) by 140 days.

(21) Appl. No.: 10/454,999

(22) Filed: Jun. 5, 2003

(65) Prior Publication Data

US 2004/0244510 A1 Dec. 9, 2004

(51) Int. Cl.
*H01R 11/01* (2006.01)
*H01R 9/00* (2006.01)
*H01R 13/00* (2006.01)
*G01D 11/00* (2006.01)

(52) U.S. Cl. .................. 439/527; 73/510; 73/866.1; 361/810; 439/913

(58) Field of Classification Search ........... 439/527, 439/894, 912, 913; 361/810, 784; 73/866.1, 73/510, 493, 866.5
See application file for complete search history.

(56) References Cited

U.S. PATENT DOCUMENTS

| | | | | |
|---|---|---|---|---|
| 3,712,089 A | * | 1/1973 | Toth | 68/210 |
| 4,725,244 A | * | 2/1988 | Chewning et al. | 439/296 |
| 6,038,130 A | * | 3/2000 | Boeck et al. | 361/735 |
| 6,547,584 B1 | * | 4/2003 | Myer et al. | 439/352 |
| 6,592,405 B1 | * | 7/2003 | Hasircoglu | 439/607 |
| 6,893,574 B1 | * | 5/2005 | Felton et al. | 216/2 |
| 2002/0090846 A1 | * | 7/2002 | Abboud | 439/76.1 |
| 2004/0169244 A1 | | 9/2004 | MacGugan | 257/416 |

* cited by examiner

*Primary Examiner*—Thomas P. Noland
(74) *Attorney, Agent, or Firm*—Bromberg & Sunstein LLP

(57) ABSTRACT

An electrical interconnect apparatus has a mounting member with a plurality of sides. The mounting member is formed from an insulator as a cuboid. Moreover, the mounting member also may be formed from a flexible circuit. Among other things, the plurality of sides includes an interface side. At least two of the plurality of sides are in electrical communication with the interface side.

15 Claims, 7 Drawing Sheets

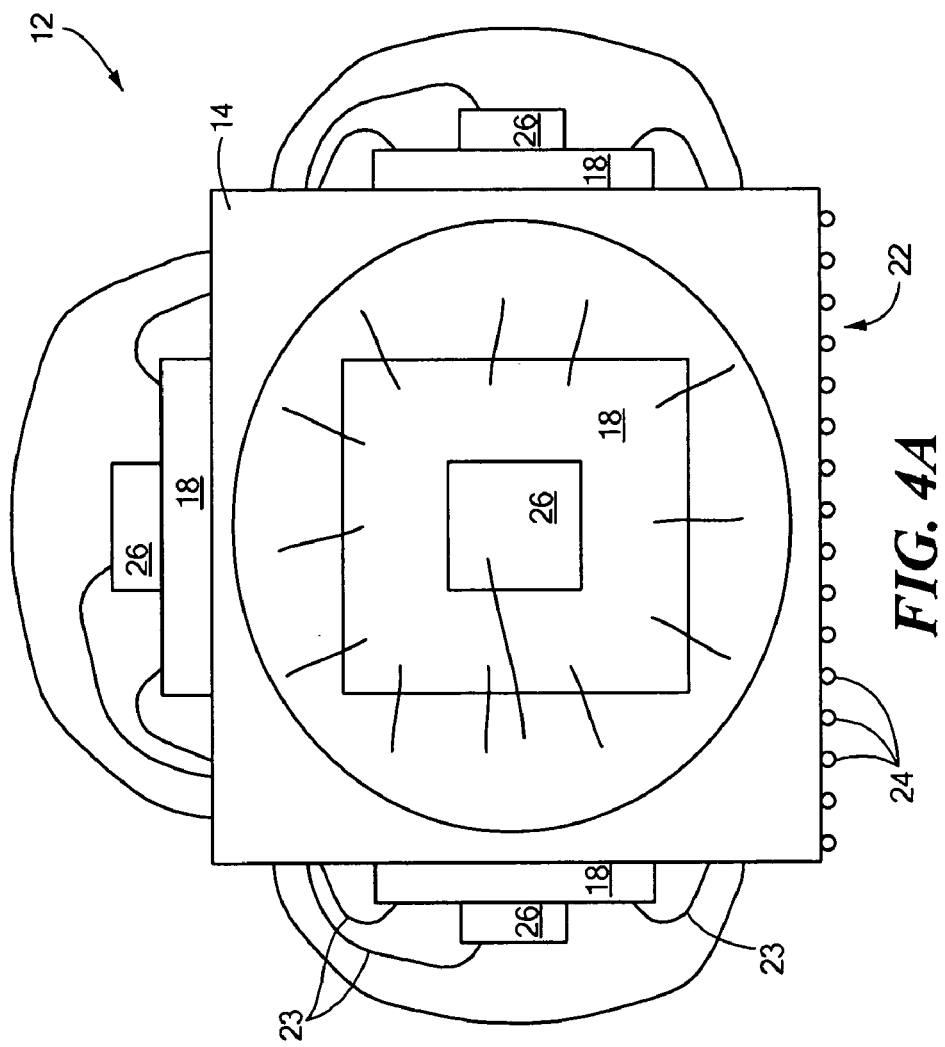

MULTI-SURFACE MOUNTING MEMBER AND ELECTRONIC DEVICE

FIELD OF THE INVENTION

The invention generally relates to electronic packaging and, more particularly, embodiments relate to the invention relates to multi-degree of freedom motion sensors.

BACKGROUND OF THE INVENTION

As its name suggests, a motion sensor detects and delivers motion information of an object to which it is attached. Among other things, motion information may include the linear acceleration and rotational movement of the object. This motion information often is critical for operation of various widely used items (e.g., an aircraft or a guided rocket). For example, an aircraft may be required to take-off at a specific pitch angle and acceleration. Accordingly, to meet those specific requirements, the aircraft may rely heavily upon its on board motion sensors.

For motion detection functionality in more than one dimension, some devices are considered to provide up to "six degrees of freedom." Specifically, as known by those in the art, motion detecting devices having six degrees of freedom provide data relating to 1) linear acceleration along three orthogonal axes (i.e., the X-axis, Y-axis, and Z-axis), and 2) rotational movement about those three axes.

Currently available multiple degree of freedom motion detecting devices (also known as "inertial measurement units," or "IMUs"), however, are relatively large. Specifically, many currently available motion detecting devices have a plurality of individual sensors (e.g., gyroscopes and/or accelerometers) stacked in different physical orientations on a circuit board. A motion detecting device having three degrees of freedom, for example, may have a circuit board with two attached accelerometers. One of the accelerometers may be a two dimensional accelerometer horizontally mounted on the face of the circuit board, while the other accelerometer may be a one dimensional accelerometer mounted to a daughterboard, which is vertically mounted to the circuit board. In other words, the one dimensional accelerometer may be mounted orthogonally to the circuit board. Use of this configuration on a single board thus often increases device size and complexity, which typically increases overall cost requirements.

SUMMARY OF THE INVENTION

In accordance with one aspect of the invention, a motion sensor has a mounting member having a plurality of mounting surfaces, and a plurality of motion sensor devices mounted to two or more of the mounting surfaces.

In some embodiments, the plurality of mounting surfaces include two orthogonal mounting surfaces. For example, the mounting member may be in the form of a cuboid. As a further example, the mounting member may be a flexible circuit. In other embodiments, the mounting member has a hollow interior with a set of interior mounting surfaces. The set of interior mounting surfaces have sensor devices mounted thereon. Among other things, the plurality of sensor devices may include at least one of gyroscopes and accelerometers. At least one of the sensor devices may include an unpackaged capped die.

The mounting member may have a contiguous electrical path extending across or between three of the plurality of mounting surfaces. Moreover, the plurality of mounting surfaces may include a first pair of orthogonal surfaces and a second pair of orthogonal surfaces. The first pair has a first conductive path between its two surfaces, while the second pair has a second conductive path between its two surfaces.

In accordance with another aspect of the invention, an electronic device has a unitary mounting member with a plurality of mounting surfaces in different planes. The electronic device further has a plurality of integrated circuits mounted to two or more of the mounting surfaces.

In accordance with yet another aspect of the invention, an electrical interconnect apparatus has a mounting member with a plurality of sides that includes an interface side. At least two of the plurality of sides are in electrical communication with the interface side.

The mounting member may have a contiguous electrical path extending across the surfaces of three of the plurality of sides. The contiguous electrical path may extend from the interface side. In addition, the plurality of sides may have a first pair of orthogonal sides and a second pair of orthogonal sides. The first pair has a first conductive path between its two sides, while the second pair has a second conductive path between its two sides.

In some embodiments, the mounting member is formed from an insulator to form a cuboid. The interface side may be capable of connecting with a circuit board. In some embodiments, the mounting member is formed from a flexible circuit. In other embodiments, the apparatus also has a plurality of sensor devices coupled with at least two of the sides of the mounting member.

BRIEF DESCRIPTION OF THE DRAWINGS

The foregoing and advantages of the invention will be appreciated more fully from the following further description thereof with reference to the accompanying drawings wherein:

FIG. 4A schematically shows one embodiment that uses motion sensors in which each die has a corresponding cap to cover the sensitive portion of its motion sensor.

DESCRIPTION OF ILLUSTRATIVE EMBODIMENTS

In illustrative embodiments of the invention, a mounting member with multiple surfaces supports multiple integrated circuits (e.g., motion sensor devices, such as accelerometers and/or gyroscopes) to produce a single electronic device (e.g., a multi-degree of freedom motion sensor device, such as an inertial measurement unit—IMU). Details of exemplary embodiments are discussed below. It should be noted, however, that such exemplary embodiments of the electronic device are motion sensor devices. Such a discussion, however, is not intended to limit all embodiments of the invention. Accordingly, some embodiments of the invention can be used with other types of electronic devices.

Figure 1:
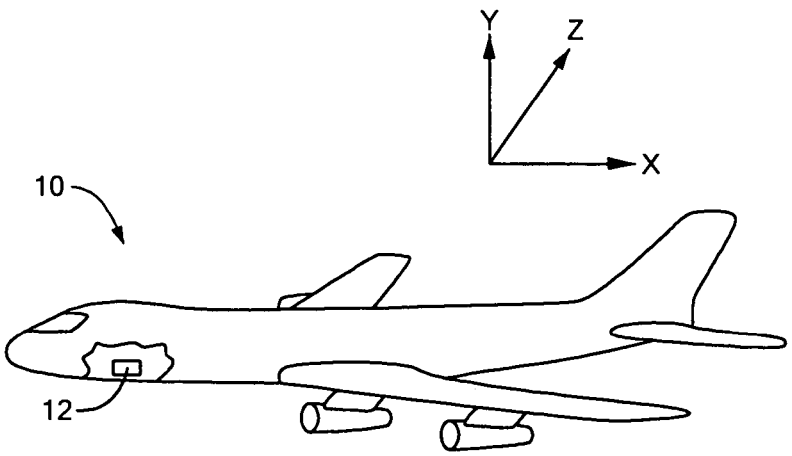
FIG. 1 schematically shows an exemplary object that can benefit from the functionality of a motion sensor unit configured in accordance with illustrative embodiments of the invention.

FIG. 1 schematically shows an exemplary object 10 that can benefit from the functionality of a motion sensor unit (hereinafter "sensor unit 12") configured in accordance with illustrative embodiments of the invention. Specifically, the exemplary object 10 shown is an airplane flying through the sky. Of course, such an object 10 is considered to have six degrees of freedom. Accordingly, the sensor unit 12 can detect both 1) linear motion along the X-axis, Y-axis, and Z-axis and 2) rotational motion about those axes.

Figure 2:
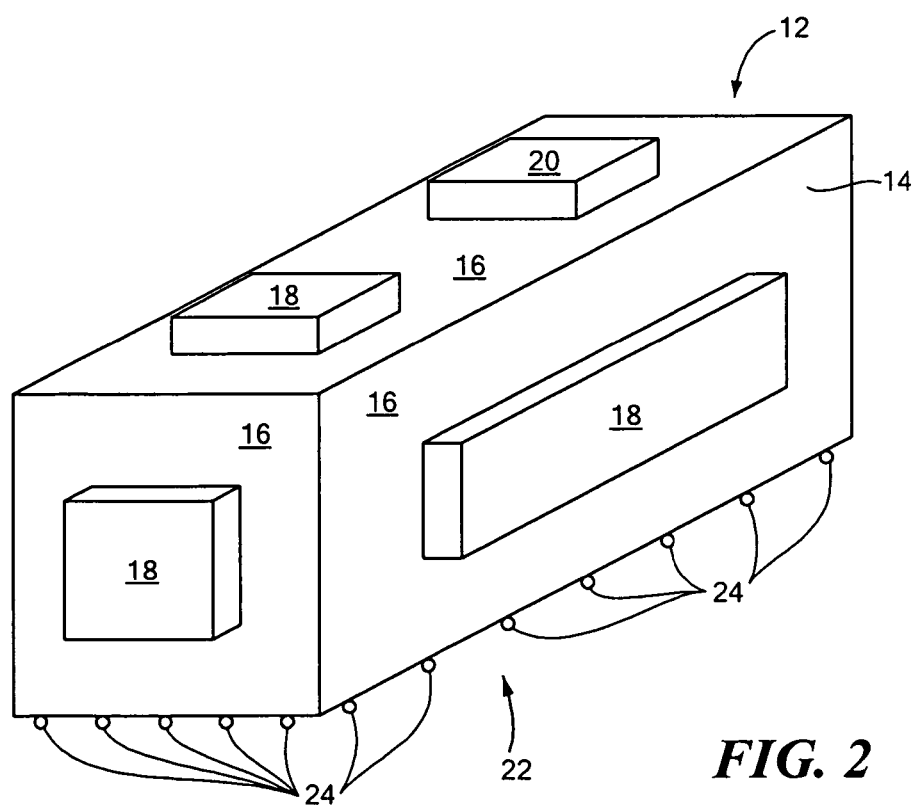
FIG. 2 schematically shows a perspective view of a sensor unit configured in accordance with illustrative embodiments of the invention.
Figure 3:
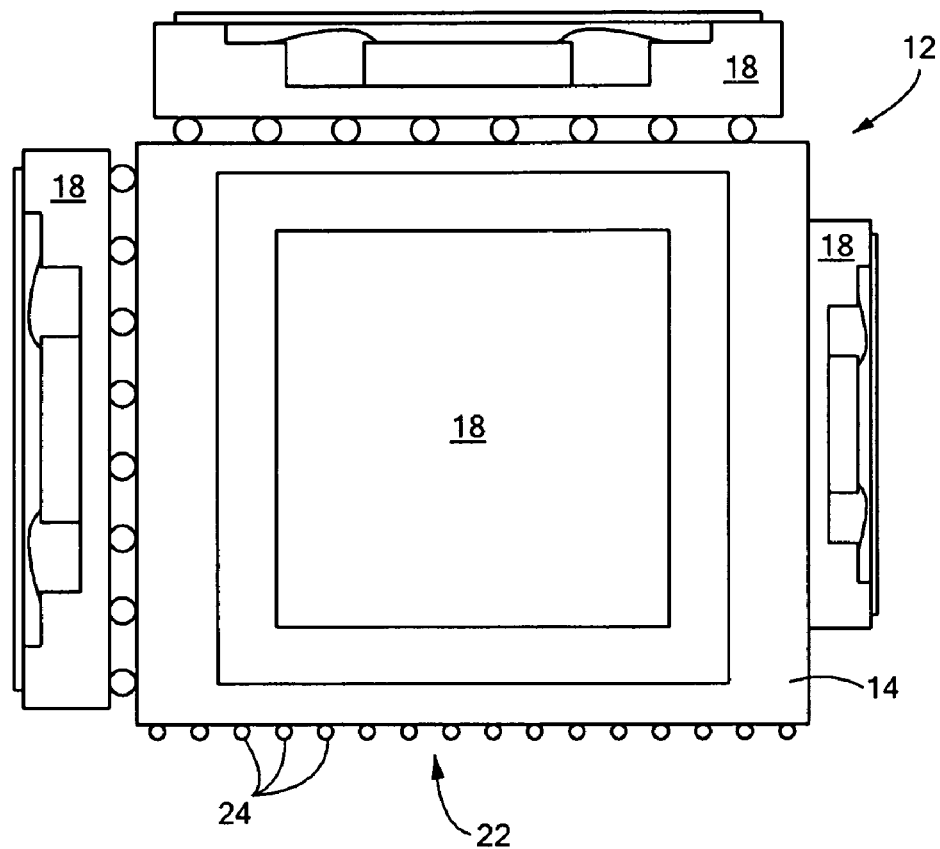
FIG. 3 schematically shows a planar front view of the sensor unit shown in FIG. 2.

FIG. 2 schematically shows a perspective view of a high density sensor unit 12 configured in accordance with illustrative embodiments of the invention. FIG. 3 shows a planar front view of the same sensor unit 12. The sensor unit 12 includes a unitary mounting member 14 with six surfaces 16 and 22 (also referred to as "sides"), and various integrated circuits 18 (i.e., motion sensing devices, hereinafter referred to as "sensor devices 18") mounted on five of the six surfaces 16. In addition to the sensor devices 18, the mounting member 14 also can have other digital or analog circuitry, such as application specific integrated circuits, microprocessors, or digital signal processors (among other things). For example, the top surface 16 shown in FIG. 2 may have a microprocessor 20 (i.e., another type of an integrated circuit) to locally process information received from any of the sensor devices 18.

In some embodiments, multiple motion sensor devices 18 are mounted on single surfaces 16 of the mounting member 14. Moreover, it is not necessary for every surface 16 to have a motion sensor device 18. For example, a three degree of freedom sensor unit 12 can have two accelerometers (each having one degree of freedom) on one side surface 16, and a third accelerometer (having one degree of freedom) mounted on the top surface.

The mounting member bottom surface, which does not having a sensor device 18, is considered to be an "interface surface 22" (or "interface side") for interfacing with other devices. To that end, the interface surface 22 has a plurality of electrically conductive interface points 24 for forwarding motion information and receiving other electronic information (e.g., self-test signals and power). In illustrative embodiments, the plurality of interface points 24 is in the form a ball grid array. Accordingly, each ball on the grid is electrically connected to a pin or other I/O interface on each sensor device 18. This electrical connection is discussed in greater detail below. In other embodiments, rather than a ball grid array, other conventional types of interface points 24 may be used, such as pins, leads, and studs. The interface surface 22 may be coupled with other electronic devices via a printed circuit board (not shown), traces on or in the mounting member 14, or other electronic connector. In some embodiments, the sensor unit 12 is permanently secured to a circuit board having predetermined locations for securing other complimentary electronic components.

The mounting member 14 illustratively is in the form of a "cuboid." As known by those skilled in the art, the mounting member 14 is considered to be in the form of a cuboid when it resembles the shape of a cube. Accordingly, some of the sides 16 of the cuboid can have a rectangular shape and thus, not a square shape. Moreover, the edges between two sides 16 of a cuboid are substantially perpendicular. In other words, the angle formed between two sides should approximate ninety degrees. Consequently, motion along or about each of the three orthogonal axes (i.e., see FIG. 1) can be accurately measured because the mounting member 14 is in this form.

The mounting member 14 can be a different shape. For example, the mounting member 14 could have a trapezoidal shape. As a further example, the mounting member 14 has only three sides of a cuboid. In other words, the mounting member 14 may have the top and bottom surfaces 16 and only one of the side surfaces 16. In such case, the bottom surface is the interface surface 22, while 1) both sides of the other two surfaces 16, and 2) the surface 16 opposite to the interface surface 22 each can have motion sensor devices 18. In yet other embodiments, the mounting member 14 can be L-shaped.

The motion sensor devices 18 can be any of a variety of sensors. As noted above, illustrative embodiments use gyroscopes and/or accelerometers. For a six degree of freedom sensor unit 12, three one-degree of freedom accelerometers can be used in conjunction with three one-degree of freedom gyroscopes. Of course, the total number of gyroscopes and accelerometers used can be reduced if multi-degree of freedom motion sensor devices 18 are used. In fact, fully functional sensor units 12 can be mounted on surfaces 16 of other sensor units 12 to provide the requisite functionality. An exemplary gyroscope used in various embodiments may be the ADXRS150 IMEMS™ gyroscope, distributed by Analog Devices, Inc. of Norwood, Mass. An exemplary accelerometer may be the ADXL311 IMEMS™ accelerometer, also distributed by Analog Devices, Inc.

FIG. 3 schematically shows four motion sensor devices 18 mounted on a single mounting member 14. Each of those motion sensor devices 18 illustratively has a sensor die (e.g., having movable structure and electronics) hermetically sealed within a ceramic or other type of package.

Figure 4B:
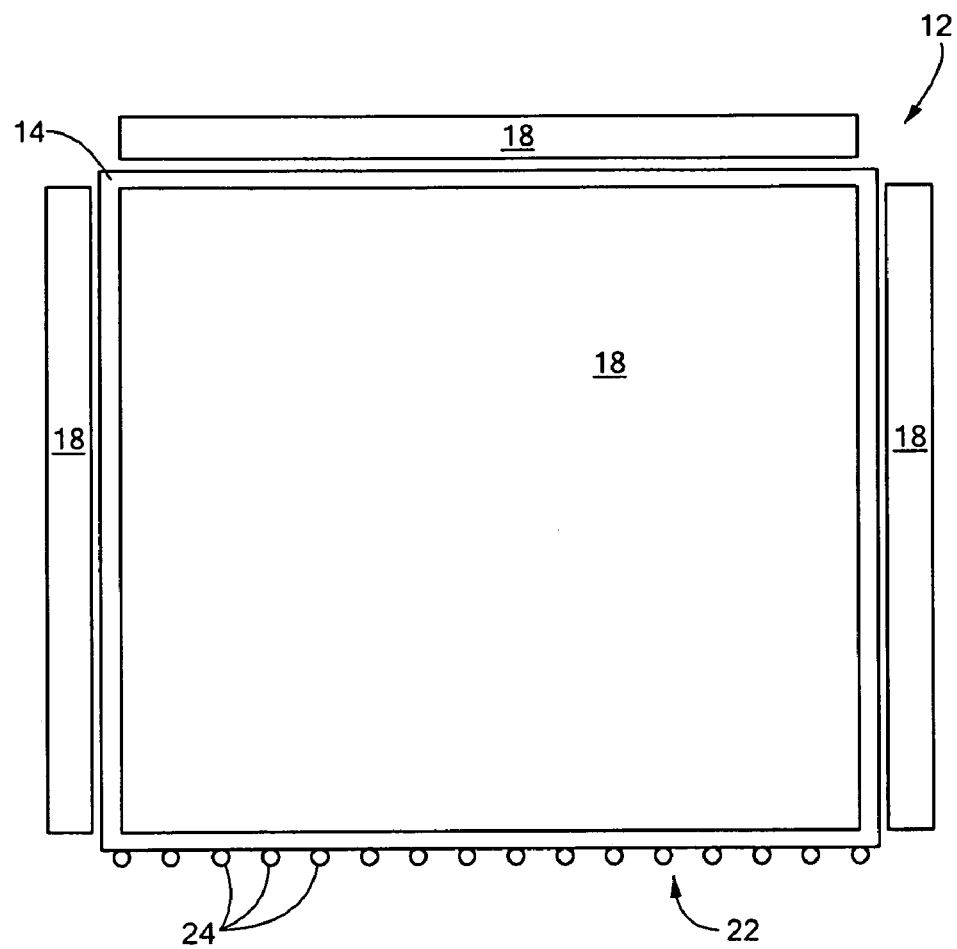
FIG. 4B schematically shows standard integrated circuits flip chip bonded to a mounting member.

In some embodiments, the overall size of the sensor unit 12 can be further reduced by using motion sensor devices 18 that are not within such packages. Specifically, FIG. 4A shows an alternative embodiment that uses motion sensor devices 18 in which the sensor devices 18 have a cap 26 that covers the sensitive portion of the motion sensor device 18. Among other things, the cap 26 can be a sheet of silicon that covers one or both the movable structure and sensor electronics. The die then can be electrically connected (e.g., wire bonded-see wire bonds 23) to the mounting member 14 in accordance with conventional processes. The die then can be encapsulated. Some embodiments bump and flip chip standard integrated circuits 18 onto the mounting member 14 (e.g., see FIG. 4B).

In a manner similar to the embodiment shown in FIG. 3, pins extending from the capless die (of FIG. 4A) interface with electrical contacts on the mounting member 14, thus electrically communicating the motion sensor devices 18 with other components. Similar capped motion sensor devices 18 and methods of producing them are discussed in greater detail in co-pending U.S. patent application Ser. No. 10/002,953, filed Oct. 23, 2001, now U.S. Pat. No. 6,893, 574 and assigned to Analog Devices, Inc. Those skilled in the art should understand that a single sensor unit 12 can include packaged, capped, and/or other types of motion sensor devices 18.

Figure 5:
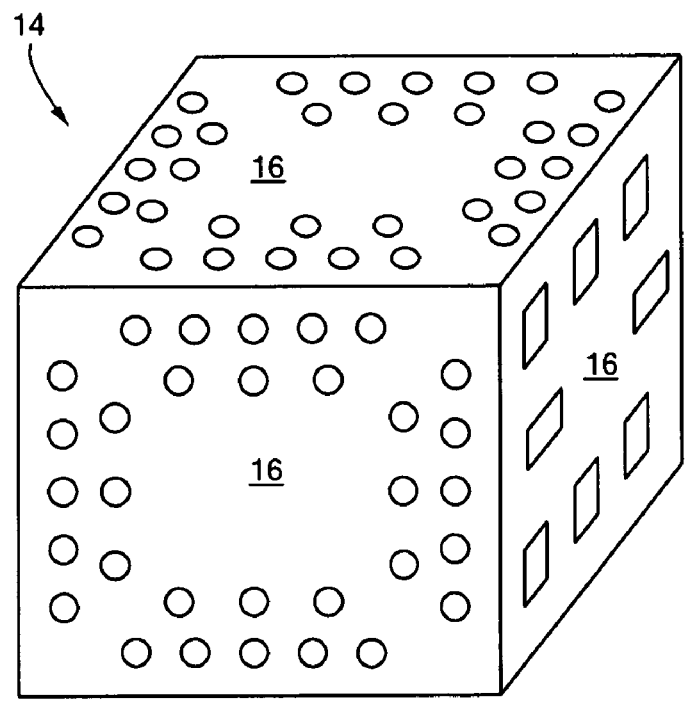
FIG. 5 schematically shows a mounting member configured in accordance with illustrative embodiments of the invention.
Figure 6:
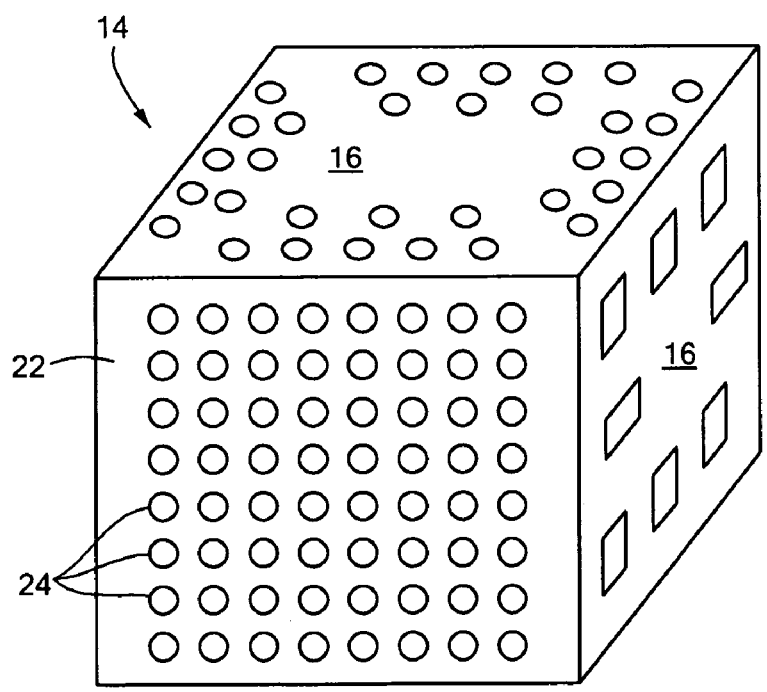
FIG. 6 schematically shows the mounting member shown in FIG. 5, but rotated to show the interface surface.

FIG. 5 schematically shows the mounting member 14 configured in accordance with illustrative embodiments of the invention. FIG. 6 schematically shows the same mounting member 14, but rotated to show the interface surface 22. The mounting member shown, which is in the form of a cuboid, has a top surface 16, bottom (interface) surface 22, and four side surfaces 16. The four side surfaces 16 and the top surface 16 each may have no motion sensor devices 18, one motion sensor device 18, or more than one motion sensor device 18.

Each side 16 has a plurality of electrically conductive interconnect locations (hereinafter "interconnects 27") for connecting with the I/O pins of the motion sensor devices 18. Among other ways, the I/O pins can be soldered to their respective interconnects 27. Circuit traces 28 (shown in FIG. 7), also referred to as "connectors" or "fine pitch lines," connect the interconnects 27 with other interconnects 27 on the other sides 16 of the mounting member 14, or with the interface points 24. Specifically, circuit traces 28 connect each interconnect 27 on the side and top surfaces 16 with one or more interface points 24 on the interface surface 22. In illustrative embodiments, each interconnect 27 on the top and side surfaces 16 connects with one interface point 24 on the interface surface 22.

Among other things, the size of the sensor unit 12 generally is a function of both the size of the sensor devices 18 and the total number of interface points 24 required on the interface side 22. For example, a given six degree of freedom sensor unit 12 may have three gyroscopes that each have one degree of freedom, a first accelerometer having two degrees of freedom, and a second accelerometer having one degree of freedom. If each gyroscope has sixteen I/O pins, and each accelerometer has eight I/O pins, then the surfaces 16 mounting the sensor devices 18 (e.g., the four side surfaces 16 and the top surface) should be configured to have sixty four interconnects 27. The interface surface 22 thus is an eight by eight (8×8) ball grid array, with traces 28 connecting each ball to one of the interconnects 27 on the other surfaces 16. Moreover, if the space (a/k/a "pitch") between the interfaces on the interface side 22 is about 0.5 millimeters, then an eight by eight ball grid array may be sized to be approximately five by five millimeters. It should be reiterated, however, that discussion of specific numbers is exemplary and not intended to limit the scope of various embodiments of the invention.

FIGS. 5 and 6 do not show the traces 28 because, in the embodiment shown, a thin ceramic laminate sheet is bonded over each side. Each laminate sheet has holes for exposing each interconnect 27. Accordingly, the holes permit the motion sensor device pins to make electrical contact with the interconnects 27. In illustrative embodiments, the laminate sheets are bonded with a conventional adhesive. Among other benefits, the laminate sheets should reduce the potential of shorting the traces 28 extending from the interconnects 27. In alternative embodiments, an insulating coating can be applied through a mask to provide similar benefits. It should be noted, however, that use of an insulating material or laminated sheet is beneficial, but not necessary in all applications.

Figure 7:
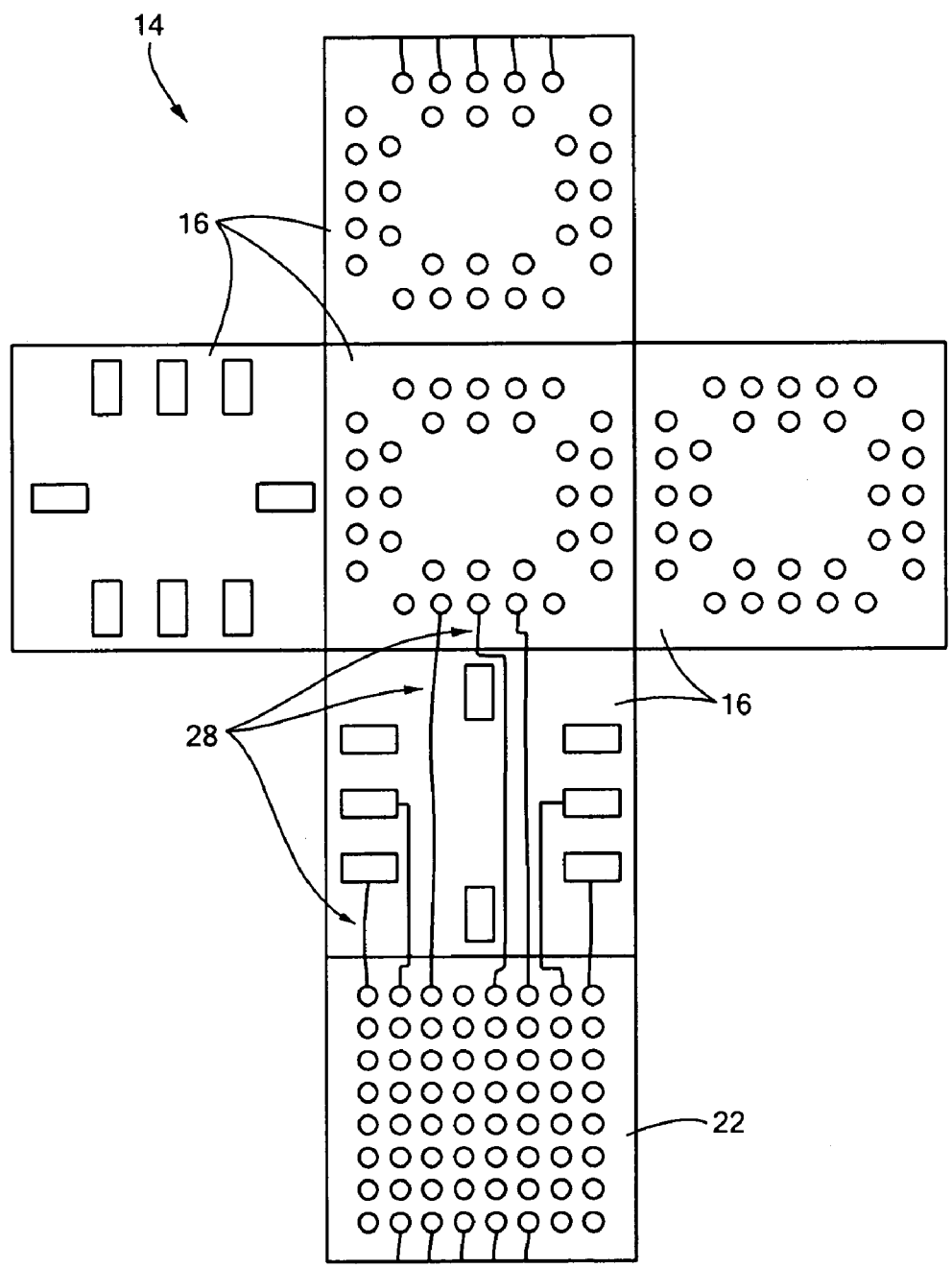
FIG. 7 schematically shows traces and interfaces in a flattened view of the mounting member shown in FIGS. 5 and 6.

FIG. 7 shows some of the traces 28. Many of the traces 28 are not shown, however, to reduce the complexity of the drawing. More specifically, FIG. 7 shows an unfolded view of the mounting member 14 of FIGS. 5 and 6 with its interface points 24, interconnects 27, and traces 28. Accordingly, FIG. 7 does not show the laminated sheets that are adhered to the mounting member 14. As exemplified by FIG. 7, the interfaces can be any type known in the art. For example, they can be pads (also known as "lands") and/or balls in a ball grid array. Moreover, the traces 28 illustratively are formed on the surface 16 of the mounting member 14 in accordance with conventional metallization processes.

In alternative embodiments, the electrical interconnections are within the mounting member 14. Accordingly, such embodiments may not require external traces 28 as shown in FIG. 7. Moreover, such alternative embodiments may have both internal interconnections and external traces 28.

Figure 8:
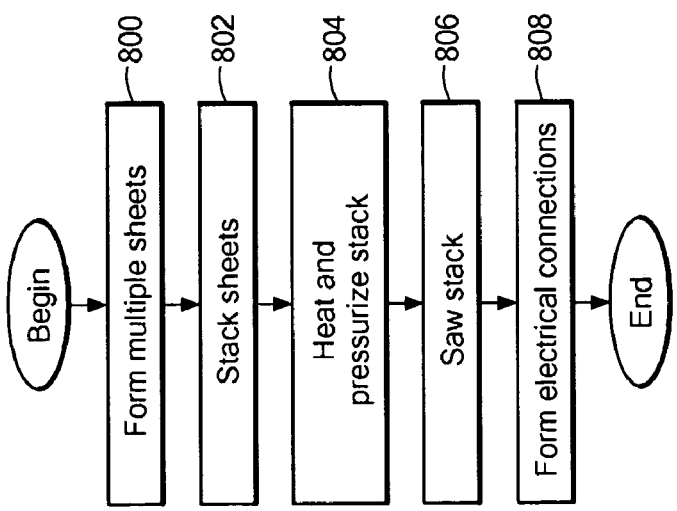
FIG. 8 shows an exemplary process of forming the mounting member shown in FIGS. 5–7.

FIG. 8 shows a process of forming the mounting member 14 shown in FIGS. 5–7. The process begins at step 800, in which multiple sheets of material are produced in accordance with conventional processes. For example, sixteen sheets that each have a thickness of 0.5 millimeters may be produced from alumina ($Al_2O_3$), or any other material used in the art for these purposes. Aluminum nitride (AlN) also may be used in some embodiments.

The sheets are stacked (step 802), and then heated and pressurized (step 804) at appropriate heats and pressures. The heat and pressure bonds the sheets together to form a unitary apparatus. This apparatus then is sawed, in a conventional manner, to form the orthogonal surfaces (step 806).

The process then continues to step 808, in which the electrical connections (i.e., interface points 24, interconnects 27, and traces 28) are formed in accordance with conventional processes. In illustrative embodiments, the traces 28 are formed using shadow mask and metal sputtering processes. For example, each of the six sides can be sputtered sequentially using a shadow mask process, thus enabling interconnection around corners. The traces can be produced from three layers. For example, a base adhesion layer formed from ti-tungsten (TiW) can serve as the first layer. The second layer may be a nickel sputtered diffusion barrier, while the third layer may be a gold solderable surface. Of course, other types of material may be used and thus, such materials merely are exemplary and not intended to limit the scope of the invention.

As suggested above, in various embodiments, some traces 28 extend from the top surface 16 to the bottom surface. In this case, such traces 28 are formed across two edges. In other words, such traces 28:

extend from the top surface 16,
over the edge between the top surface 16 and one of the side surfaces 16,
across the side surface 16,
across the edge between the side surface 16 and the interface surface 22, and
across the interface surface 22 to the destination interface point 24.

As also noted above, some embodiments have motion sensor devices 18 on two of the side surfaces 16. Accordingly, this embodiment has traces 28 extending from two sides, across one edge, to the interface side 22. Of course, some embodiments have both types of traces 28.

Each interface point 24 on the interface surface 22 thus effectively controls one I/O pad (or more pads, depending upon the connection) on a motion sensor device 18 or other electronic device mounted on the mounting member 14. Accordingly, those skilled in the art may control use the mounted motion sensor devices 18 or other electronic devices via such pads in any desired manner. The motion sensor devices 18 thus may entirely or partially cooperate, and/or they may act independently. This decision is based upon the intended use of the sensor unit 12.

Figure 9:
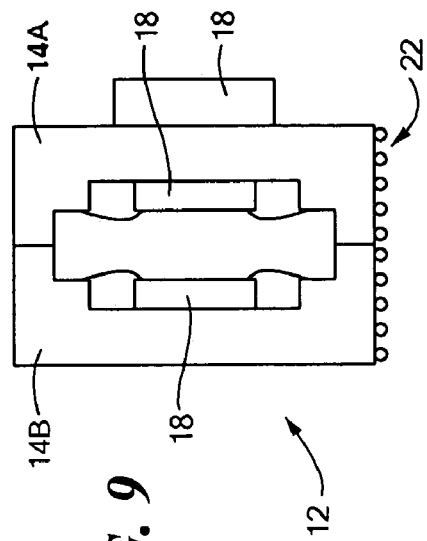
FIG. 9 schematically shows a cross-sectional view of an alternative embodiment of the invention.
Figure 10:
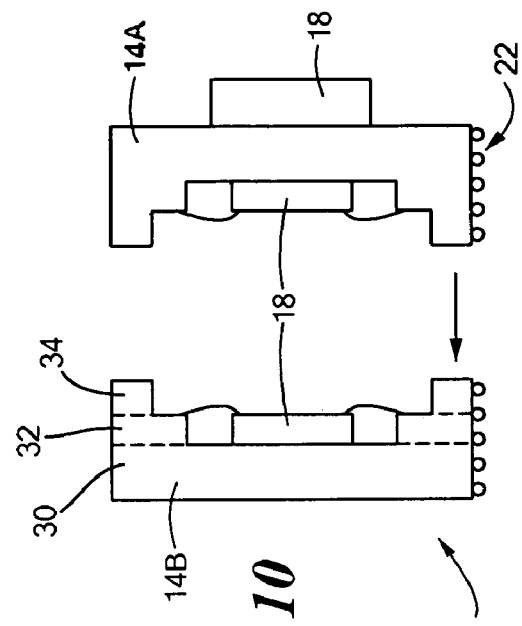
FIG. 10 schematically shows the embodiment of FIG. 9 with its mounting member separated into two pieces.

In some embodiments, the mounting member 14 has a hollow interior. FIG. 9 shows a cross-sectional view of one implementation of this embodiment, while FIG. 10 shows the same mounting member 14 separated into two pieces 14A and 14B. Specifically, this embodiment has a hollow interior with interior walls for mounting motion sensor devices 18. The hollow interior also may have sufficient electrical interconnection components, such as die attach pads and wire bond pads. The exemplary sensor unit 12 shown in FIGS. 9 and 10 has two sensor devices 18 within the interior, and one sensor device 18 on the exterior.

To that end, each half 14A and 14B of the mounting member 14 may be produced in a three part process. Specifically, as shown in FIG. 10, a first layer 32 is formed on a base layer 30, while a second layer 34 is formed on the first layer 32. Circuit paths may be formed to interconnect the internal motion sensor devices 18 with the interface surface 22 or other surface 16. After the motion sensor devices 18 are mounted to the cavity in each half of the mounting member 14, the two halves 14A and 14B may be coupled to form an interior chamber that contains the internal motion sensor devices 18. The halves 14A and 14B may be coupled by any conventional process (e.g., a soldering operation) that hermetically seals the interior. The seal, however, depends upon the application and thus, does not necessarily have to be hermetic. Shared power and ground may be distributed internally to minimize I/O requirements. The external interface points 24, interconnects 27, and traces 28 may be formed in a manner similar to that discussed above (either before or after the two halves 14A and 14B are coupled).

Other types of mounting members may be used. For example, the mounting member 14 may be a conventional flexible circuit that folds at selected locations. The flexible circuit may be cut to a shape that approximates that shown in FIG. 7. It then may be folded to ensure that its different surfaces 16 accurately represent the axes of interest. Circuit traces 28, interconnects 27, and interface points 24 may be applied in any manner known in the art. The motion sensor devices 18 can be mounted either before or after the flexible circuit is folded into a cuboid.

It should be reiterated that although various embodiments of the invention have been described herein as used with microelectromechanical systems (MEMS), principles of the disclosed embodiments can apply to other types of electronic components. Accordingly, different types of integrated circuits may be used. For example, in addition to or instead of integrated circuits with motion sensing functionality, other standard integrated circuits can be used (e.g., for signal conditioning).

Although various exemplary embodiments of the invention are disclosed below, it should be apparent to those skilled in the art that various changes and modifications can be made that will achieve some of the advantages of the invention without departing from the true scope of the invention.

What is claimed is:

1. An electrical interconnect apparatus comprising:
    a mounting member having a plurality of sides, the mounting member being formed from an insulator as a cuboid, the mounting member being formed from a flexible circuit,
    the plurality of sides including an interface side,
    at least two of the plurality of sides being in electrical communication with the interface side.

2. The electrical interconnect apparatus as defined by claim 1 wherein the mounting member has a contiguous electrical path extending across the surfaces of three of the plurality of sides.

3. The electrical interconnect apparatus as defined by claim 2 wherein the contiguous electrical path extends from the interface side.

4. The electrical interconnect apparatus as defined by claim 1 wherein the plurality of sides includes a first pair of orthogonal sides and a second pair of orthogonal sides, the first pair having a first conductive path between its two sides, the second pair having a second conductive path between its two sides.

5. The electrical interconnect apparatus as defined by claim 1 wherein the interface side is capable of connecting with a circuit board.

6. The electrical interconnect apparatus as defined by claim 1 further comprising a plurality of sensor devices coupled with at least two of the sides of the mounting member.

7. An electrical interconnect apparatus comprising:
    a mounting member having a plurality of sides, the mounting member being formed from an insulator as a cuboid, the mounting member having two or more circuit dies on one of the plurality of sides,
    the plurality of sides including an interface side,
    at least two of the plurality of sides being in electrical communication with the interface side.

8. The electrical interconnect apparatus as defined by claim 7 wherein the mounting member has a contiguous electrical path extending across the surfaces of three of the plurality of sides.

9. The electrical interconnect apparatus as defined by claim 7 wherein the mounting member comprises a flexible circuit.

10. The electrical interconnect apparatus as defined by claim 7 wherein the plurality of sides includes a first pair of orthogonal sides and a second pair of orthogonal sides, the first pair having a first conductive path between its two sides, the second pair having a second conductive path between its two sides.

11. The electrical interconnect apparatus as defined by claim 7 wherein the interface side is capable of connecting with a circuit board.

12. The electrical interconnect apparatus as defined by claim 7 further comprising a plurality of sensor devices coupled with at least two of the sides of the mounting member.

13. An electrical interconnect apparatus comprising:
    a unitary mounting member having a plurality of sides forming an interior, the mounting member being formed from an insulator as a cuboid, the interior having a set of interior mounting surfaces, at least one of the interior surfaces having at least one circuit die mounted thereon,
    the plurality of sides including an interface side,
    at least two of the plurality of sides being in electrical communication with the interface side.

14. The electrical interconnect apparatus as defined by claim 13 wherein the mounting member comprises a flexible circuit.

15. The electrical interconnect apparatus as defined by claim 13 further comprising a plurality of circuit dies coupled with one of the plurality of sides.

* * * * *